United States Patent
Walkington

(10) Patent No.: US 7,877,076 B2
(45) Date of Patent: Jan. 25, 2011

(54) ERROR CALCULATION CIRCUIT FOR MIXER

(75) Inventor: Robert Walkington, Tokyo (JP)

(73) Assignee: NEC Corporation, Tokyo (JP)

( * ) Notice: Subject to any disclaimer, the term of this patent is extended or adjusted under 35 U.S.C. 154(b) by 850 days.

(21) Appl. No.: 11/663,829

(22) PCT Filed: Sep. 16, 2005

(86) PCT No.: PCT/JP2005/017544

§ 371 (c)(1),
(2), (4) Date: Mar. 27, 2007

(87) PCT Pub. No.: WO2006/035682

PCT Pub. Date: Apr. 6, 2006

(65) Prior Publication Data

US 2007/0262827 A1 Nov. 15, 2007

(30) Foreign Application Priority Data

Sep. 29, 2004 (WO) ............... PCT/JP2004/014663

(51) Int. Cl.
*H04B 1/16* (2006.01)

(52) U.S. Cl. .................................... 455/323; 455/63.1
(58) Field of Classification Search ............... 455/63.1, 455/126, 296, 313, 323, 334, 317; 375/296, 375/298, 308; 332/103, 123, 162

See application file for complete search history.

(56) References Cited

U.S. PATENT DOCUMENTS

| | | | | |
|---|---|---|---|---|
| 4,243,955 A | * | 1/1981 | Daniel et al. | 332/167 |
| 5,001,773 A | * | 3/1991 | White | 455/118 |
| 5,012,208 A | | 4/1991 | Makinen et al. | |
| 5,343,171 A | * | 8/1994 | Fox et al. | 332/167 |
| 5,708,399 A | * | 1/1998 | Fujii et al. | 332/103 |
| 5,793,817 A | * | 8/1998 | Wilson | 375/297 |
| 6,711,396 B1 | * | 3/2004 | Bergsma et al. | 455/317 |
| 6,763,227 B2 | * | 7/2004 | Kramer | 455/115.1 |
| 7,206,557 B2 | * | 4/2007 | Aytur et al. | 455/118 |
| 2002/0137487 A1 | | 9/2002 | Yochem | |
| 2002/0191713 A1 | * | 12/2002 | McVey | 375/308 |
| 2003/0112049 A1 | | 6/2003 | Wang | |
| 2004/0162038 A1 | | 8/2004 | Kanazawa | |

FOREIGN PATENT DOCUMENTS

| | | |
|---|---|---|
| EP | 0 477 720 | 4/1992 |
| JP | 09-307596 | 11/1997 |
| JP | 10-070582 | 3/1998 |
| JP | 11-220506 | 8/1999 |
| JP | 2000-261252 | 9/2000 |
| JP | 2002-198745 | 7/2002 |
| JP | 2003-125014 | 4/2003 |

* cited by examiner

Primary Examiner—Blane J Jackson
(74) Attorney, Agent, or Firm—Young & Thompson

(57) ABSTRACT

An error calculation circuit used for compensating a carrier leak at an output signal of a mixer has a sign extraction unit for extracting the sign of a baseband signal which is applied to the mixer, an envelope detecting unit for performing envelope detection on the output signal of the mixer, and a signal processing unit for generating an error compensation signal to compensate the carrier leak based on the result of the sign extraction and envelope detection. The signal processing unit preferably calculates the compensation signal by using multiplication of the sign of the baseband signal by an amplitude of the envelope.

13 Claims, 10 Drawing Sheets

ERROR CALCULATION CIRCUIT FOR MIXER

TECHNICAL FIELD

The present invention relates to an error calculation circuit for a mixer and modulator, and particularly to an error calculation circuit suitable for suppressing carrier leak at an output of a mixer or modulator which is used for carrier-suppressed direct conversion or the like.

BACKGROUND ART

Mixers and modulators are devices which modulate low frequency signals or baseband signals onto a higher frequency carrier for transmission purposes. One type of modulators is an AM (amplitude modulation) modulator, where the lower frequency data is modulated onto amplitude of the higher frequency carrier. The operation of such an AM modulator can be depicted as a simple multiplication of the lower and higher frequency signals. The AM modulator is also referred to as an AM mixer. A typical AM modulator has a local oscillation (LO) signal input to which the carrier signal (i.e., local oscillation signal) is applied, a signal input to which the low frequency signal is applied, and an output for providing a modulated signal. A particular disadvantage of the basic AM modulator is that the output signal contains the higher frequency carrier signal, which carries no useful information and uses transmission power.

There are some types of mixers and modulators which can suppress carrier signals at their output terminals. One of such a mixer is a double sideband suppressed carrier (DSBSC) mixer. The DSBSC mixer is also referred to as a DBM (double balanced mixer).

An example of the basic implementation of the DSBSC mixer is illustrated in FIG. 1A. The illustrated DSBSC mixer has current source 101, six transistors M1 through M6, a pair of balanced input terminals 102, 103 to which a baseband signal is applied, a pair of balanced input terminals 104, 105 to which a local oscillation (LO) signal is applied, and a pair of balanced output terminals 106, 107 for delivering the modulated signal as a current output. Transistors M1 through M3 constitute a first AM mixer while transistors M4 through M6 constitute a second AM mixer. One end of current source 101 is connected to the ground potential point, and sources of transistors M1, M4 are commonly connected to the other end of current source 101 so that the first and second AM mixers share current source 101. In the first AM mixer, a gate of transistor M1 is connected to non-inverting input terminal 102 of the baseband signal, and a drain of transistor M1 is connected to sources of transistors M2, M3. Gates of transistor M2, M3 are connected to inverting input terminal 105 and non-inverting input terminal 104, respectively, and drains of transistors M2, M3 are connected to inverting output terminal 107 and non-inverting output terminal 106 of this DSBSC mixer, respectively. In the second AM mixer, a gate of transistor M4 is connected to inverting input terminal 103 of the baseband signal and a drain of transistor M4 is connected to sources of transistors M5, M6. Gates of transistor M5, M6 are connected to non-inverting input terminal 104 and inverting input terminal 105, respectively, and drains of transistors M5, M6 are connected to inverting output terminal 107 and non-inverting output terminal 106 of this DSBSC mixer, respectively.

The DSBSC mixer suppresses the carrier signal at output terminals 106, 107 thereof by cancelling the local oscillator components at the outputs of the two AM mixers, which is possible because the local oscillation signals are applied to the first and second AM mixers in opposing phases to each other. This arrangement is commonly used because of the increased efficiency.

As well known to those skilled in the art, an example of applications of the DSBSC mixer is a quadrature (IQ) modulator which is used for orthogonal amplitude modulation and/or demodulation. As shown in FIG. 1B, a typical quadrature modulator comprises signal input terminals 111, 112 for first and second signals, respectively, LO input terminal 113 for receiving a local oscillation (LO) signal, phase shifter 114 for shifting phase of the local oscillation signal by 90 degrees, first and second DSBSC mixers 115, 116 for receiving the first and second signals, respectively, combiner 117 for adding the outputs of both DSBSC mixer 115, 116, and RF output terminal 118 connected to the output of combiner 117. The local oscillation signal is directly supplied to first DSBSC mixer 115 from LO input terminal 113 while second DSBSC mixer 116 receives the local oscillation signal through phase shifter 114. In such a quadrature modulator, the first signal corresponds to an I (in-phase) component of the output modulated signal while the second signal corresponds to a Q (quadrature) component. Therefore, the first signal is also referred to as an I signal and the second signal a Q signal.

A problem with the fabrication of DSBSC mixers arises due to the carrier suppression requirement. This typically arises due to unavoidable manufacturing tolerances of the two AM mixers, which are usually implemented as parts of a monolithic chip such as a semiconductor IC (integrated circuit) chip. If there is imperfect matching of transistors M1 through M6 in the DSBSC mixer, then not only the sidebands of the modulated signal are transmitted, but also a leak at the local oscillator frequency occurs and is transmitted. This leak of the local oscillation component is known as a carrier leak, and equivalent to a DC offset in the DSBSC mixer. In the case of a quadrature modulator, the DC offset is observed in a constellation chart of the output signal of the modulator as a deviation of the center of signal traces from the origin of the constellation. Occurrence of the carrier leak is undesirable as it makes it difficult to capture the phase of the transmitted signal during demodulation, and can also cause undesired interference with other communications.

Efforts to fix this problem can involve adding, during manufacture, a circuit for applying a static DC offset voltage to the mixer input in order to cancel the carrier signal. For example, Japanese Patent Laid-open Application No. 2002-198745 (JP, P2002-198745A) discloses an arrangement in which a DC offset voltage is applied to a local oscillation input terminal. However, this approach cannot account for the long term drift in the circuit parameters and operating temperature. In other words, if the DC offset in a mixer output is fixed for a long time, this DC offset is easily compensated by adding an external DC offset voltage to the mixer. However, if the DC offset of the mixer tends to drift, the influence of the drift is difficult to remove and deteriorates the quality of communication.

An additional approach is to increase the physical size of the transistors in the mixer circuit to reduce the deviations in circuit parameters. But this is unsuitable for high frequency circuitry as the increased parasitic capacitance reduces the gain of each transistor at the carrier frequency. In addition, special layout techniques can also be used to cancel the process error gradient across the chip surface, but in practice this method increases the circuit area and cost and may still give insufficient carrier suppression.

In U.S. Pat. No. 5,012,208 issued to Makinen et al., a solution for the problem of local oscillation signal leak (i.e., DC offset) in a quadrature modulator is disclosed. FIG. 2 illustrates an arrangement of the circuit of Makinen et al. In this circuit, an output of quadrature modulator 121 is supplied to amplifier 122, and the output of amplifier 122 is supplied to RF output terminal 123 and power measuring circuit 124. Power measuring circuit 124 provides an envelope of the transmitted RF signal from amplifier 122. The output of power measuring circuit 124 is supplied to amplifier 125 through high-pass filter 126. Linear correlators 127, 128 correlates the I (in-phase) and Q (quadrature) input signals received at input terminals 129, 130 with the output signal of amplifier 125, respectively. The outputs of correlators 127, 128 are integrated by integrators 131, 132. Subtractor 133 subtracts the output of integrator 131 from the I input signal received at input terminal 129 and supplies the result to quadrature modulator 121 as an I signal. Similarly, subtractor 134 subtracts the output of integrator 132 from the Q input signal received at input terminal 130 and supplies the result to quadrature modulator 121 as a Q signal.

The approach of Makinen et al. calculates error compensation signals using the envelope of the transmitted RF signal and the time domain signals at the I and Q inputs. By correlating the envelope signal with the input signals in linear correlators 127, 128, and integrating the results by integrator 131, 132, error compensation signals are extracted to compensate the modulator offsets. The error compensation signals are subtracted from the input signals which are applied to the modulator. The two error compensation signals are separately derived from the single envelope signal due to the correlation over a long time period between the average DC level of the I and Q input signals and the average peak level of the envelope signal in the I and Q phase domains.

An essential component of the system of FIG. 2 is a linear multiplier (i.e., correlator) with a very low DC offset. Any large DC offset of this component will prevent the full cancellation of the DC offsets of the modulator. Typically, the system of FIG. 2 would be difficult to implement purely in the analog domain due to the requirement of a linear analog multiplier with a low DC offset. Such circuits tend to be complicated and therefore difficult to implement with the required accuracy for this application. Therefore the system of FIG. 2 would be expected to be implemented in the digital domain apart from the section of the loop from the quadrature modulator to the power measuring circuit and the amplifier. Implementing the system in the digital domain requires an ADC (analog-to-digital converter) to convert the signal at the amplifier output into a digital signal, and a digital multiplier is required to be implemented for each of the correlators.

Therefore, it is desired to provide an error calculation circuit which generates an error compensation signal to be applied to a mixer or a modulator, has a simple circuit structure, and is easily manufactured.

Japanese Patent Laid-open Application No. 9-307596 (JP, 9-307596, A) discloses an arrangement in which a cancel carrier signal is generated and added to the modulated carrier signal.

Japanese Patent Laid-open Application No. 2000-261252 (JP, P2000-261252A) discloses a distortion compensation circuit for an RF power amplifier in which a result of envelope detection of an input signal is used for compensating distortion components in an output of the amplifier.

Japanese Patent Laid-open Application No. 10-70582 (JP, 10-070582, A) discloses an arrangement for reducing the leak carrier in a quadrature modulator by generating a beat signal between a modulated signal and an local oscillation signal, detecting the beat signal and generating a DC offset signal (i.e., error compensation signal) based on the detection result.

Japanese Patent Laid-open Application No. 11-220506 (JP, 11-220506, A) discloses an arrangement for reducing the leak carrier in a quadrature modulator output. In this arrangement, a local oscillation signal is doubled in frequency and separated into quadrature phase components. These phase components are modulated and then combined.

Japanese Patent Laid-open Application No. 2003-125014 (JP, P2003-125014A) discloses a quadrature modulator in which DC offset voltages are added to I and Q balanced input signals.

DISCLOSURE OF THE INVENTION

An object of the present invention is to provide an error calculation circuit which generates an error compensation signal to be applied to a mixer or a modulator, has a simple circuit structure, and is manufactured without difficulties.

Another object of the present invention is to provide a mixer which can reduce influences of a DC offset at the output of the mixer and be fabricated without difficulties.

A further object of the present invention is to provide a modulator which can reduce the carrier leak at the output of the modulator and be fabricated without difficulties.

The object of the present invention is achieved by an error calculation circuit for a mixer which comprises: a sign extraction unit for extracting sign of an information signal which is applied to the mixer, an envelope detecting unit for performing envelope detection on an output signal of the mixer, and a signal processing unit for generating a compensation signal based on the result of the sign extraction and envelope detection.

The second object of the present invention is achieved by a mixer module comprising a mixer and an error calculation circuit, wherein the error calculation circuit comprises: a sign extraction unit for extracting sign of an information signal which is applied to the mixer, an envelope detecting unit for performing envelope detection on a signal supplied from an output of the mixer, and a signal processing unit for generating a compensation signal based on the result of the sign extraction and envelope detection, the compensation signal being fed to the mixer.

In the present invention, the compensation signal is preferably applied to the mixer for compensating a DC offset of the mixer. The information signal is a signal conveying information. A typical information signal is, but not limited to, a baseband signal.

The error calculation circuit according to the present invention may further include a first low-pass filter and a second low-pass filter. An output of the envelope detection unit may be supplied to the signal processing unit through the first low-pass filter while the information signal may be supplied to the sign extraction unit through the second low-pass filter.

According to the present invention, a DC offset of a mixer such as a DSBSC mixer is automatically compensated by measuring only the sign of the information signal and the magnitude of the RF carrier delivered from the mixer. The sign of the information signal is detected by, for example, a comparator, and the magnitude of the RF carrier is detected by an envelope detector or envelope detecting unit such as an AM detector.

The system according to the present invention relies on the fact that a DC offset in the signal at the mixer output causes a ripple in the envelope of the modulated signal, which can be measured using an envelope detecting unit. By combining the output of the envelope detecting unit with the sign or polarity of the input signal it is possible to obtain the mean DC offset of the modulated signal to allow an error compensating signal to be applied to the mixer. In order to extract the DC errors during the modulator operation, the system multiplies the instantaneous magnitude of the RF carrier, which is measured by the envelope detecting unit, with the instantaneous sign of the input signal to obtain the error signal. By integrating this error signal over a long enough time period, an estimate is obtained for the DC offset which can be applied to a suitable compensating input terminal built into the mixer. The slow adaptation of the error compensation signal while the modulator is in use means no special calibration sequence is necessary.

According to the present invention, a quadrature modulator module comprising a two sets of the mixer module according to the present invention, wherein an output of the quadrature modulator is supplied to the envelope detecting unit of each set. Alternatively, the two sets of the mixer modules in the quadrature modulator module may share a single envelope detecting unit. The output of the quadrature modulator is supplied to the single envelope detecting unit and the output of the envelope detecting unit is then supplied to the signal processing unit of each set.

The above and other objects, features, and advantages of the present invention will become apparent from the following description with reference to the accompanying drawings which illustrate an example of the present invention.

BEST MODE FOR CARRYING OUT THE INVENTION

Figure 3A:
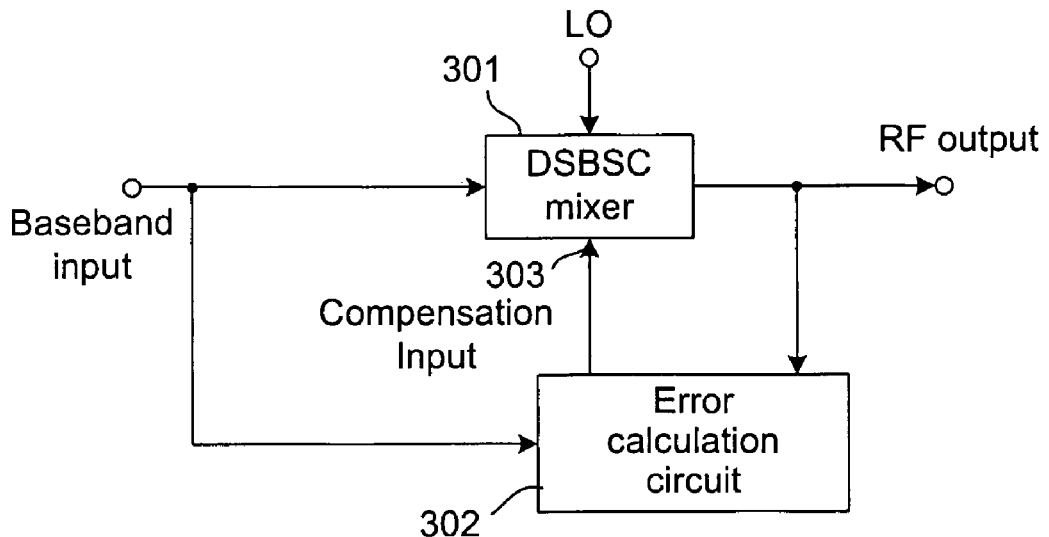
FIG. 3A is a block diagram illustrating a DSBSC mixer module according to an embodiment of the present invention in which an error calculation circuit is connected to a compensation input of a DSBSC mixer.

As shown in FIG. 3A, a mixer module according to an embodiment of the present invention which can suppress carrier leak has DSBSC mixer 301 and error calculation circuit 302. DSBSC mixer 301 is supplied with a baseband signal and a local oscillation (LO) signal, and generates an RF output signal in which the local oscillation signal is modulated by the baseband signal. Error calculation circuit 302 is supplied with the baseband signal and the RF output signal, and generates an error compensation signal. The error compensation signal is supplied to DSBSC mixer 301 at compensation input 303 of mixer 301.

Figure 1A:
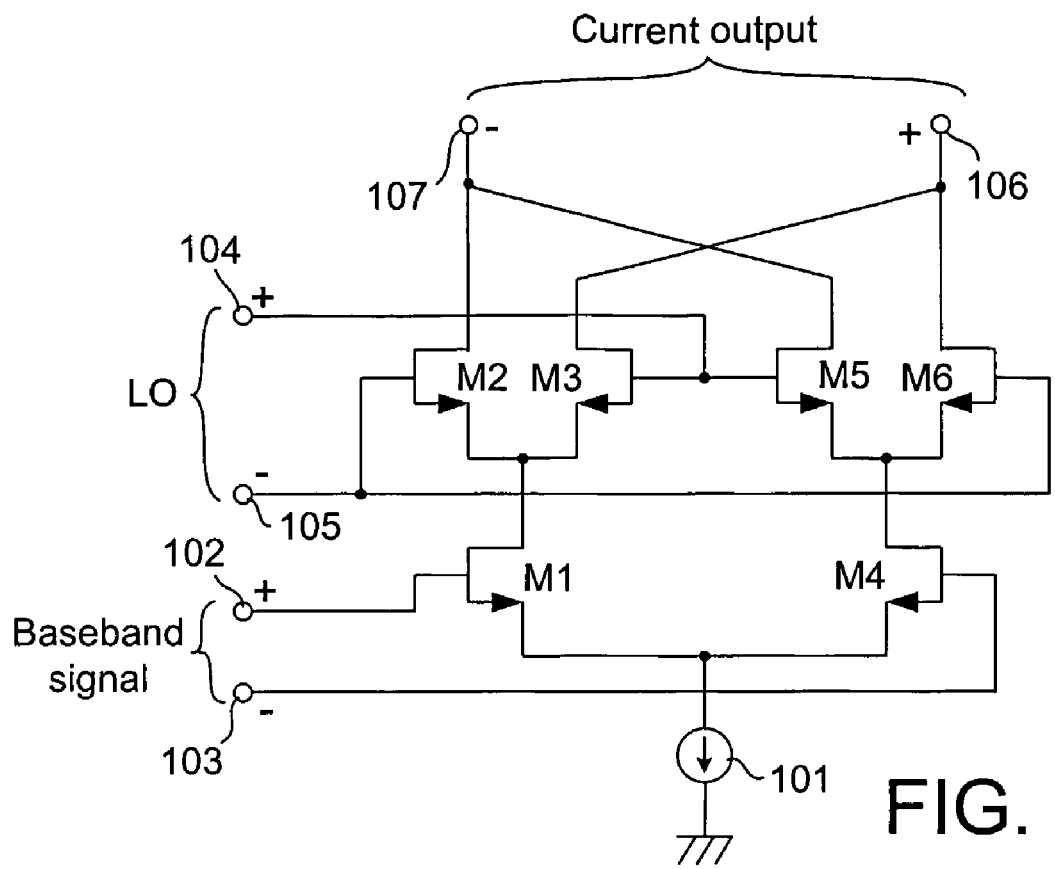
FIG. 1A is a diagram illustrating a typical circuit level implementation of a DSBSC (double sideband suppressed carrier) mixer.
Figure 3B:
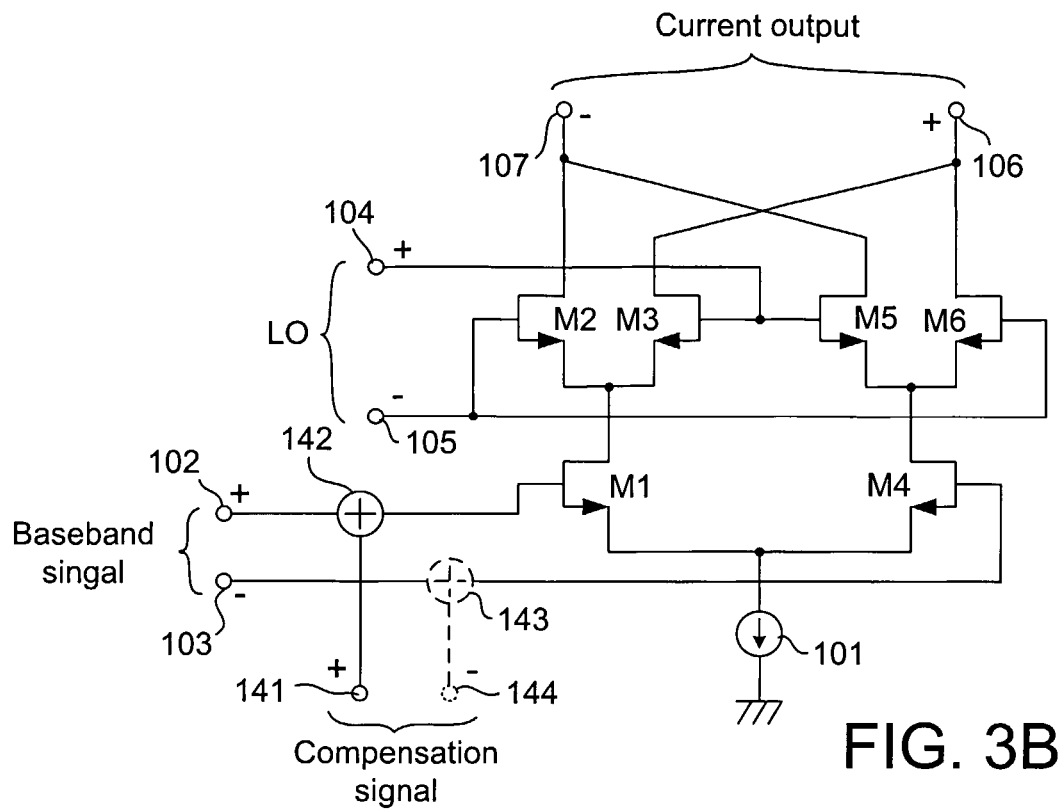
FIG. 3B is a circuit diagram illustrating an example of a DSBSC mixer having a compensation input.

Here, a DSBSC mixer having a compensation input will be described. The DSBSC mixer shown in FIG. 3B differs from the mixer shown in FIG. 1A in that the former mixer has compensation input terminal 141 and adder 142. Adder 142 adds the baseband signal received at non-inverting input terminal 102 and an error compensation signal received at compensation input terminal 141, and applies the result to the gate of transistor M1. In this arrangement, the error compensation signal is added to the input baseband signal thereby suppressing the carrier leak at output terminals 106, 107 of the mixer. If the error compensation signal is applied to the mixer as a balanced signal, another adder 143 may inserted between inverting input terminal 103 and the gate of transistor M4, and the balanced compensation signal may applied to adders 142, 143 through compensation input terminals 141, 144 as shown in dashed lines in FIG. 3B.

Figure 3C:
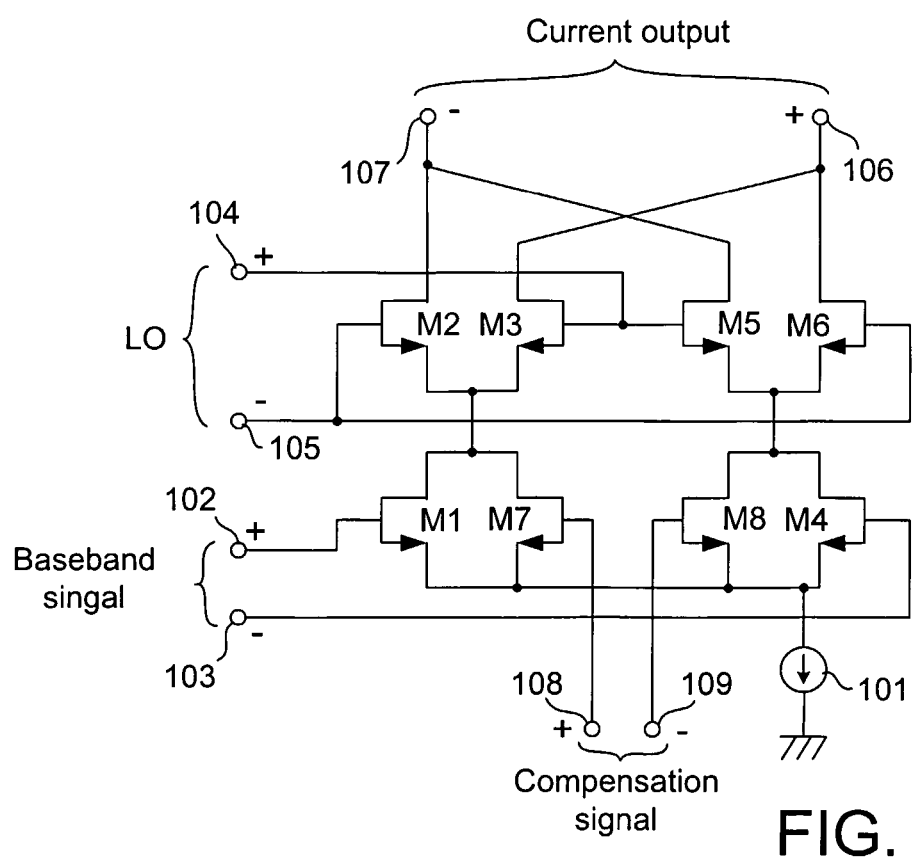
FIG. 3C is a circuit diagram illustrating another example of a DSBSC mixer having a compensation input.

FIG. 3C illustrates another example of a DSBSC mixer having a compensation input terminal. The illustrated DSBSC mixer is constructed by adding two transistors M7, M8 to the DSBSC mixer shown in FIG. 1A. Transistor M7 has a source and drain connected to the source and drain of transistor M1, respectively, while transistor M8 has a source and drain connected to the source and drain of transistor M4, respectively. A gate of transistor M7 is connected to non-inverting compensation input terminal 108, and a gate of transistor M8 is connected to inverting compensation input terminal 109. In this arrangement, compensation input terminals 108, 109 are built-in compensation terminals of the mixer. A balanced error compensation signal is applied to compensation input terminals 108, 109. The effect of the application of the error compensation signal to the DSBSC mixer is equivalent to that of the addition of the compensation signal to the input signal of the mixer shown in FIG. 1A. If the error compensation signal is an unbalanced signal, such an unbalanced signal is applied to one of input terminals 108, 109 while a DC bias voltage is applied the other input terminal.

Figure 4:
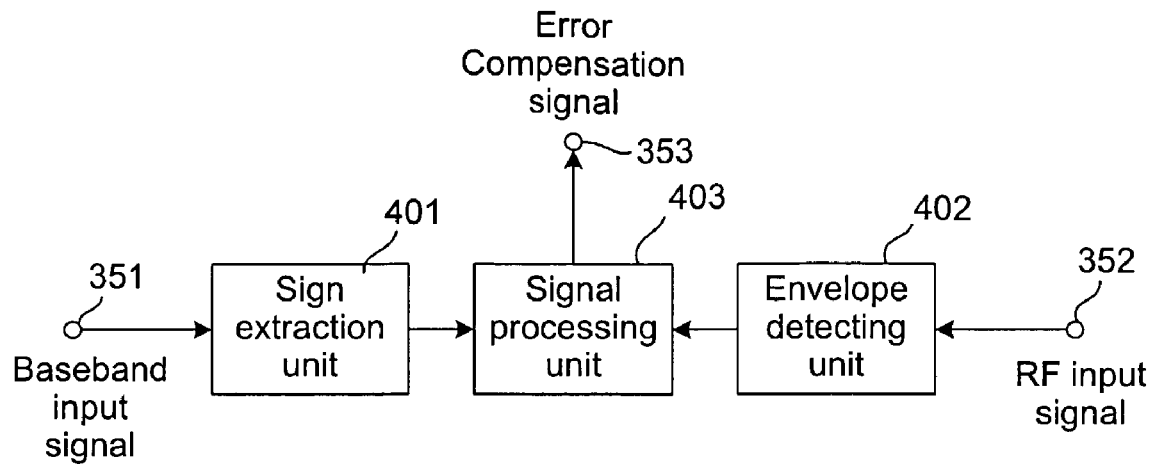
FIG. 4 is a block diagram illustrating the error calculation circuit which calculates an error compensation signal used for compensating a DC offset in a DSBSC mixer.

The fundamental arrangement of error calculation circuit 302 is illustrated in FIG. 4. Error calculation circuit 302 is provided with sign extraction unit 401 for detecting instantaneous sign or polarity of the input baseband signal received at baseband input terminal 351, envelope detecting unit 402 for performing envelope detection on the RF output signal from the mixer which is received at RF input terminal 352, and signal processing unit 403 for generating an error compensation signal based on the results of the sign extraction in unit

401 and the envelope detection in envelope detecting unit 402. An output from signal processing unit 403 is connected to output terminal 353 from which the error compensation signal is applied to the DSBSC mixer.

One possible way to implement sign extraction unit 401 would be use of a comparator which outputs a binary signal in accordance with the instantaneous polarity or sign of the input baseband signal. Without the requirement of accurate linear multipliers, the additional simplification of the circuit according to the present invention leads to a reduced implementation difficulty and cost. Envelope detecting unit 402 may comprise a simple AM detector or AM detection circuit.

Figure 5:
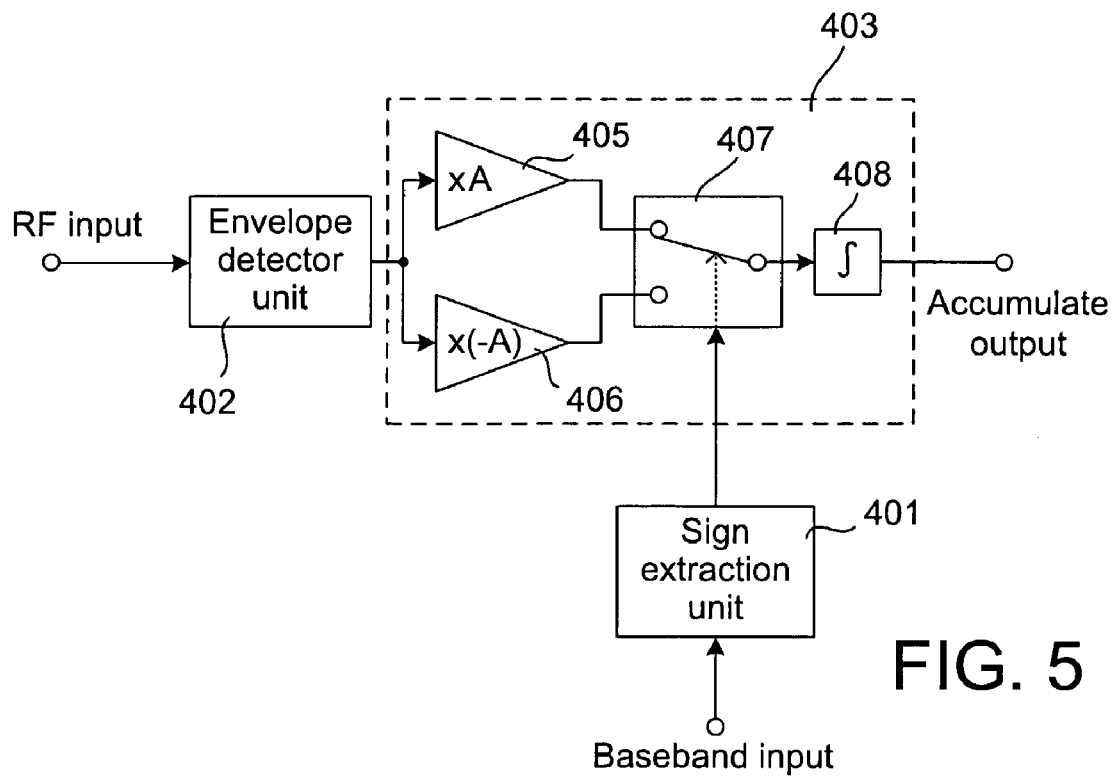
FIG. 5 is a block diagram illustrating another implementation of the error calculation circuit.

An example implementation of the error calculation circuit is illustrated in FIG. 5. Signal processing unit 403 comprises non-inverting amplifier (xA) 405, inverting amplifier (x(−A)) 406, switch 407, and integrator 408. The output of integrator 408 is connected to output terminal 353 of the error calculation circuit. Amplifiers 405, 406 have the same absolute amplification factor A, and are supplied with the output of envelope detecting unit 402. Switch 407 selects one of the outputs of amplifiers 405, 406 based on the output of sign extraction unit 401, and the selected output is then fed to integrator 408. For example, the output from non-inverting amplifier 405 is selected during a period in which the polarity of the input baseband signal is positive, and the output from inverting amplifier 406 is selected during a period in which the polarity of the input baseband signal is negative. In other words, the output of sign extraction unit 401 is used to switch the polarity of the signal from envelope detecting unit 402, which is then fed to integrator 408 which calculates the final error compensation signal.

The detailed operation of the error calculation circuit shown in FIG. 4 is as follows: The RF output signal from the mixer enters envelope detecting unit 402, which recovers the envelope of the RF signal. At the same time, the sign of the input baseband signal is detected using sign extraction unit 401. The sign signal and the extracted envelope are fed into signal processing unit 403, which then calculates the error compensation signal. In the implementation shown in FIG. 5, the output of sign extraction unit 401 is used to switch between inverted and non-inverted outputs of envelope detecting unit 402 and the output of switch 407 is fed to integrator 408 which calculates the DC error compensation signal over an extended time period.

Since the DC offset in the signal at the mixer output causes a ripple in the envelope of the modulated signal, carrier leak is suppressed by applying an error compensation signal calculated from the DC offset to the mixer. According to the present embodiment, the envelope of the modulated signal, i.e. the RF output signal, is detected by envelope detecting unit 402. Assuming that a long term integrated value of waveform of the baseband signal is zero, it is possible to obtain the mean DC offset of the modulated signal by combining the output of envelope detecting unit 402 with the sign of the input baseband signal obtained by sign extraction unit 401. The obtained DC offset is applied to the mixer as an error compensation signal. Specifically, in order to extract the DC errors during the modulator operation, the system multiplies the instantaneous magnitude of the RF carrier, which is measured by envelope detecting unit 402, with the instantaneous sign of the input baseband signal to obtain an error signal. By integrating this error signal over a long enough time period, an estimate is obtained for the DC offset which can be applied to a suitable compensating input terminal built into the mixer. In an example case, the local oscillation signal has a frequency ranging several hundred megahertz to several gigahertz, and the input baseband signal has a frequency ranging several hundred kilohertz to several megahertz. Envelope detecting unit 402 has a time constant of, for example, several tens of picoseconds, which is enough to regenerate the input baseband signal. Integrator 408 in signal processing unit 403 has a time constant of, for example, several tens of milliseconds to several hundred milliseconds, which is enough to extract the DC drift component of the baseband signal. Because of such a slow adaptation of the error compensation during operation of the mixer, no special calibration sequence is necessary in this arrangement.

Figure 6:
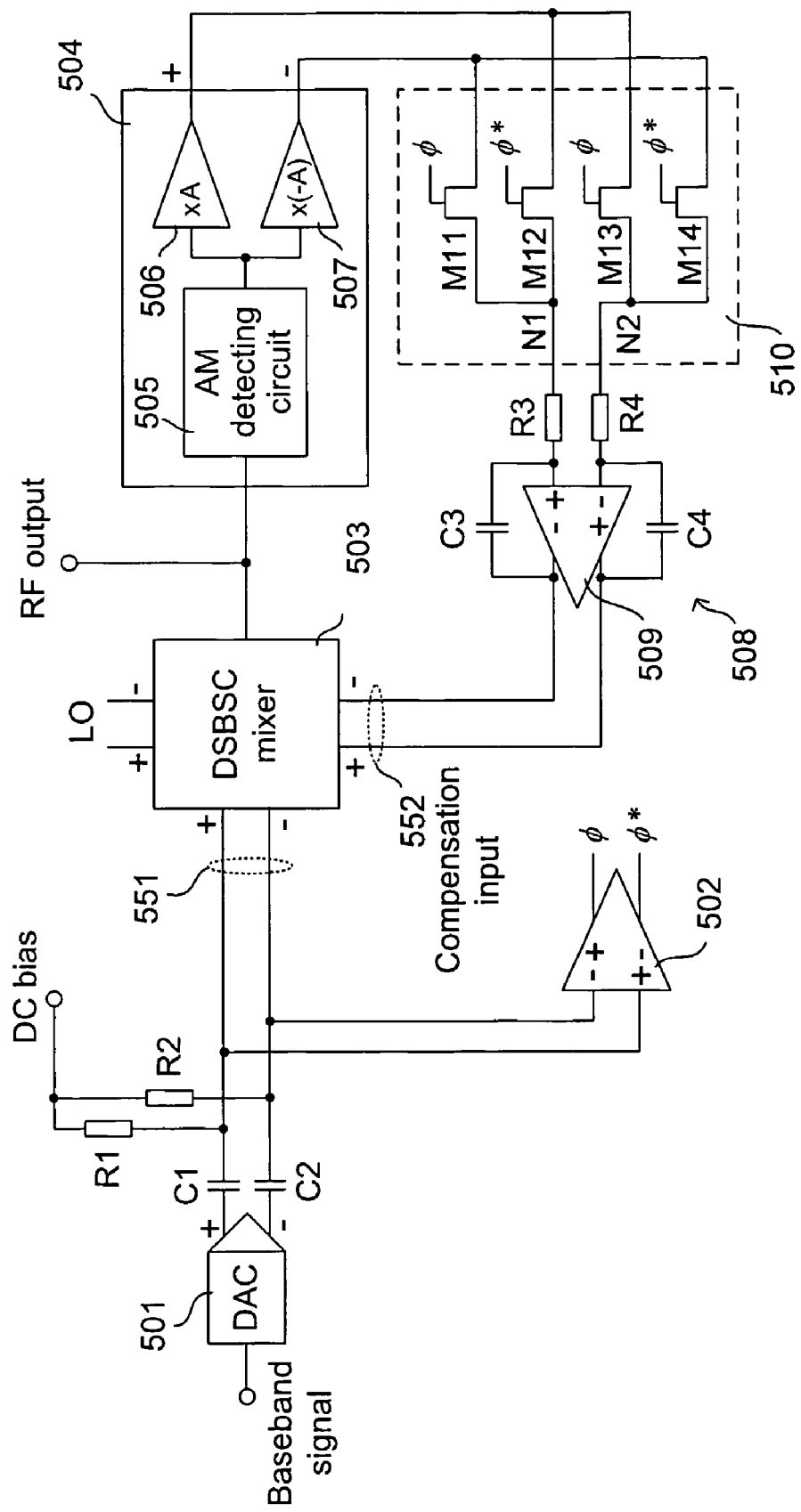
FIG. 6 is a diagram illustrating an entirely analog domain implementation of the arrangement illustrated in FIG. 3A using a mixer module with built-in DC offset compensation.

FIG. 6 illustrates an entirely analog domain implementation of the arrangement illustrated in FIG. 3A. In this example implementation, the mixer is provided with built-in local oscillator leak compensation.

DAC (digital-to-analog converter) 501 receives a baseband signal as a digital signal, converts the received signal to supply the converted signal as a balanced analog baseband signal through capacitors C1, C2. The balanced analog baseband signal is fed to comparator 502 and the signal input terminals 551 of DSBSC mixer 503 having compensation input terminals 552. A biasing circuit having resistors R1, R2 applies bias voltage to the balanced analog baseband signal. A circuit shown in FIG. 3C, for example, may be used as DSBSC mixer 503. Balanced local oscillation (LO) signal is also supplied to DSBSC mixer 503.

Comparator 502 has a non-inverting input terminal, an inverting input terminal, and a pair of complementary output terminals. The balanced analog baseband signal is applied between the non-inverting and inverting input terminals. Comparator 502 delivers complementary binary output signals $\phi$, $\phi^*$ from the output terminals indicated by (+) and (−), respectively in accordance with the polarity of the balanced analog baseband signal. When the potential at the non-inverting input terminal is higher than that at the inverting input terminal, comparator 502 delivers signal $\phi$ of "1" and signal $\phi^*$ of "0". Otherwise, comparator 502 delivers signal $\phi$ of "0" and signal $\phi^*$ of "1."

An RF output signal from DSBSC mixer 503 is applied to envelope detector 504 which comprises AM detecting circuit 505, non-inverting amplifier (xA) 506, and inverting amplifier (x(−A)) 507. AM detecting circuit 505 performs an envelope detection of the RF output signal to supply the result to the amplifiers 506, 507. Amplifiers 506, 507 have the same absolute amplifying factor A.

Integrator 508 comprises operational amplifier 509 of balanced output type, resistors R3, R4, and capacitors C3, C4. Capacitor C3 is arranged between the inverting output and non-inverting input of operational amplifier 509, and capacitor C4 is arranged between the non-inverting output and inverting input of amplifier 509. Resistor R3 connects between the non-inverting input terminal of amplifier 509 and node N1, and resistor R4 connects between the inverting input terminal and node N2. The balanced output signal of operational amplifier 509 is applied to the balanced compensation input terminals 552 of DSBSC mixer 503.

Switch circuit 510 has four transistors M11 through M14. Transistor M11 has a gate to which signal $\phi$ from comparator 502 is applied and connects the output of inverting amplifier 507 and node N1. Transistor M12 has a gate to which signal $\phi^*$ is applied and connects the output of non-inverting amplifier 506 and node N1. Transistor M13 has a gate to which signal $\phi$ is applied and connects the output of non-inverting amplifier 506 and node N2. Transistor M14 has a gate to which signal $\phi^*$ is applied and connects the output of inverting amplifier 507 and node N2.

Figure 2:
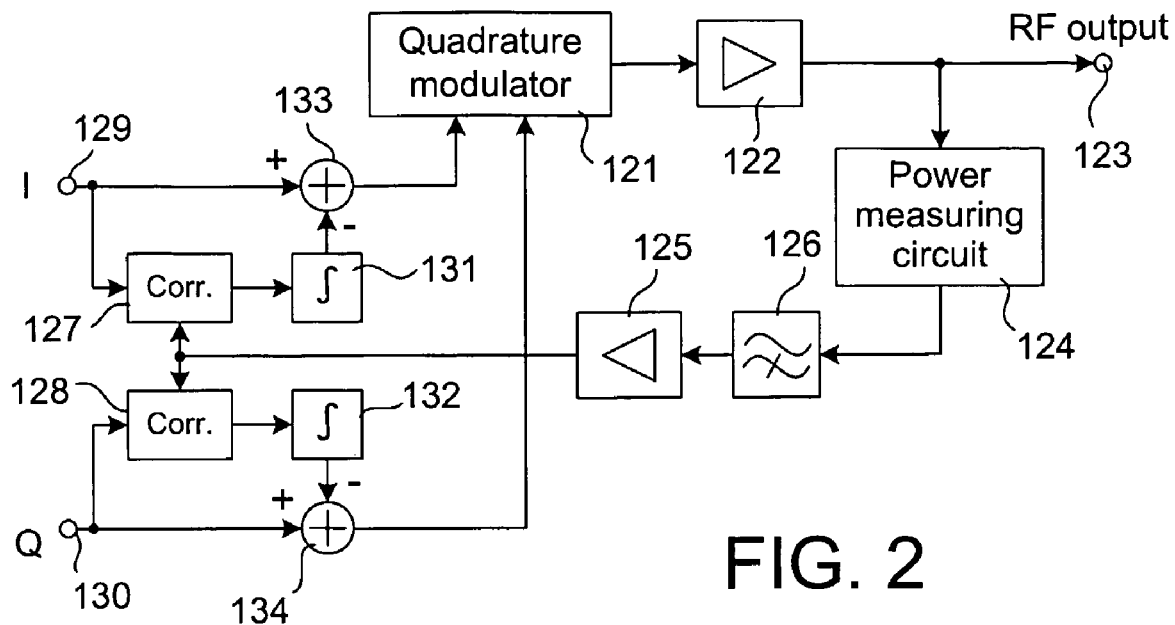
FIG. 2 is a block diagram illustrating a prior art arrangement of a quadrature modulator with local oscillator leak suppression.

As shown in FIG. 6, in contrast with the prior art solution of FIG. 2, the present embodiment enables a simple completely analog solution to be implemented with useful accuracy, as the critical detection of the I and Q input signals is reduced to a simple sign detection, allowing an accurate and inexpensive comparator to be used instead of a costly linear correlator. It is an advantage to be able to fully separate the digital and RF chips of a wireless system as these often come from separate part vendors.

Figure 1B:
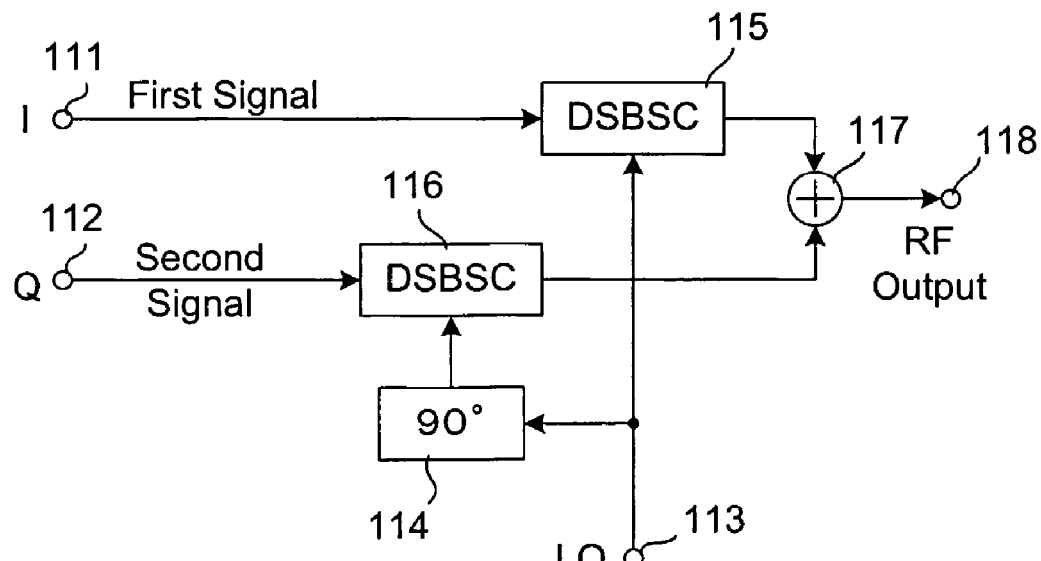
FIG. 1B is a diagram illustrating a typical quadrature (IQ) modulator.
Figure 7:
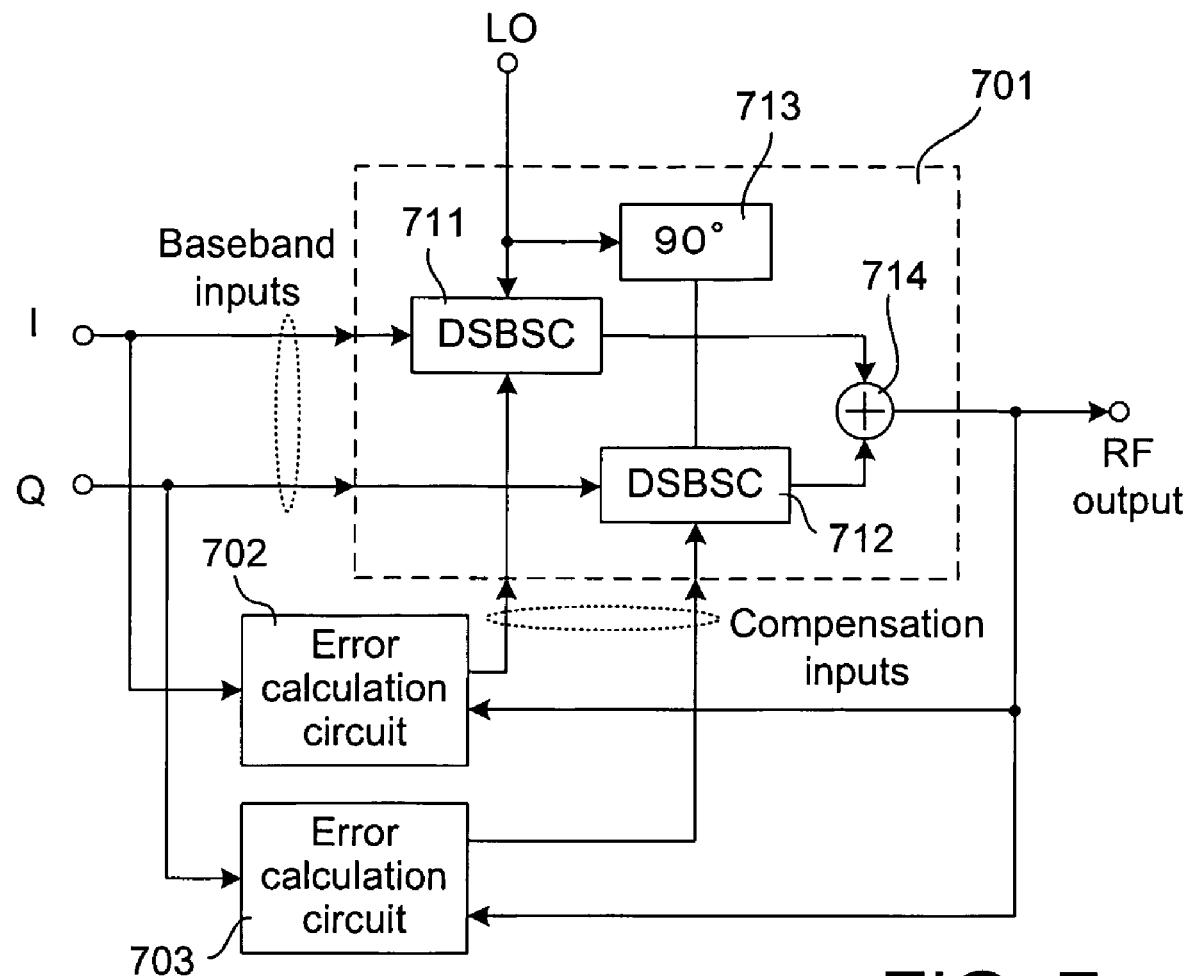
FIG. 7 is a block diagram illustrating a quadrature modulator module in which the error calculation circuits are connected to compensation inputs of a modulator.

The present invention is also applied to a quadrature (IQ) modulator. As described above and shown in FIG. 1B, a typical quadrature modulator is made from two DSBSC mixers, a phase shifter and a combiner. Therefore, a quadrature modulator module according to the present invention has two DSBSC mixers each of which is connected to the error calculation circuit described above. FIG. 7 illustrates such a quadrature modulator module with a carrier leak suppression function.

Quadrature modulator 701 is supplied with I and Q components and generates an RF output signal. DSBSC mixers 711, 712 with compensation inputs, phase shifter 713 for local oscillation (LO) signal, and combiner 714 for combining the outputs of DSBSC mixers 711, 712 are provided within quadrature modulator 701. DSBSC mixers 711, 712 receive the I signal component and Q signal component, respectively. Error calculation circuit 702 is supplied with the I component and the RF output signal from quadrature modulator 701, and generates an error compensation signal for the I component which is applied to the compensation input of DSBSC mixer 711. Similarly, error calculation circuit 703 is supplied with the Q component and the RF output signal, and generates an error compensation signal for the Q component which is applied to the compensation input of DSBSC mixer 712.

In the case of compensating a DC offset of the quadrature modulator module shown in FIG. 7, the RF output from quadrature modulator 701 enters two error calculation circuits 702, 703 in parallel. In the case of the I signal component, the I component at the RF output can be reconstructed, with a superimposed artifact due to the Q component, by switching the polarity of the output of the envelope detecting unit by the sign of the I signal component inside error calculation circuit 703 for the I component. Similarly, inside error calculation circuit 703 for Q component, switching the polarity of the output of the envelope detecting unit by the sign of the Q component reconstructs the Q signal at the RF output with the superimposed artifact due to the I component. If the time constant over which the signals are observed is made sufficiently long, then the superimposed artifacts on the recovered signals will appear as noise, allowing them to be removed by simple signal processing. As for this application only the two DC components in an output constellation of the quadrature modulator module are of interest, it is possible to recover the DC components by feeding the recovered output I and Q signals with the artifacts into the integrators in the two error calculation circuits, which perform the following three functions: Firstly, they will remove the unwanted artifact by averaging it out as noise. Secondly, they will function as a low-pass filter for the extracted signal, allowing the DC level of the constellation at the output to be extracted as an error signal. Thirdly, the inclusion of an integrator in the loop will allow the loop to converge to a zero error final solution, as the error compensation signal applied to the modulator input will increase until the average detected DC level from which the modulator constellation becomes zero.

In the case of the quadrature modulator module, neither multipliers nor linear correlators are required to extract the error signals when using the error calculation circuit in contrast to the system shown in FIG. 2.

Figure 8:
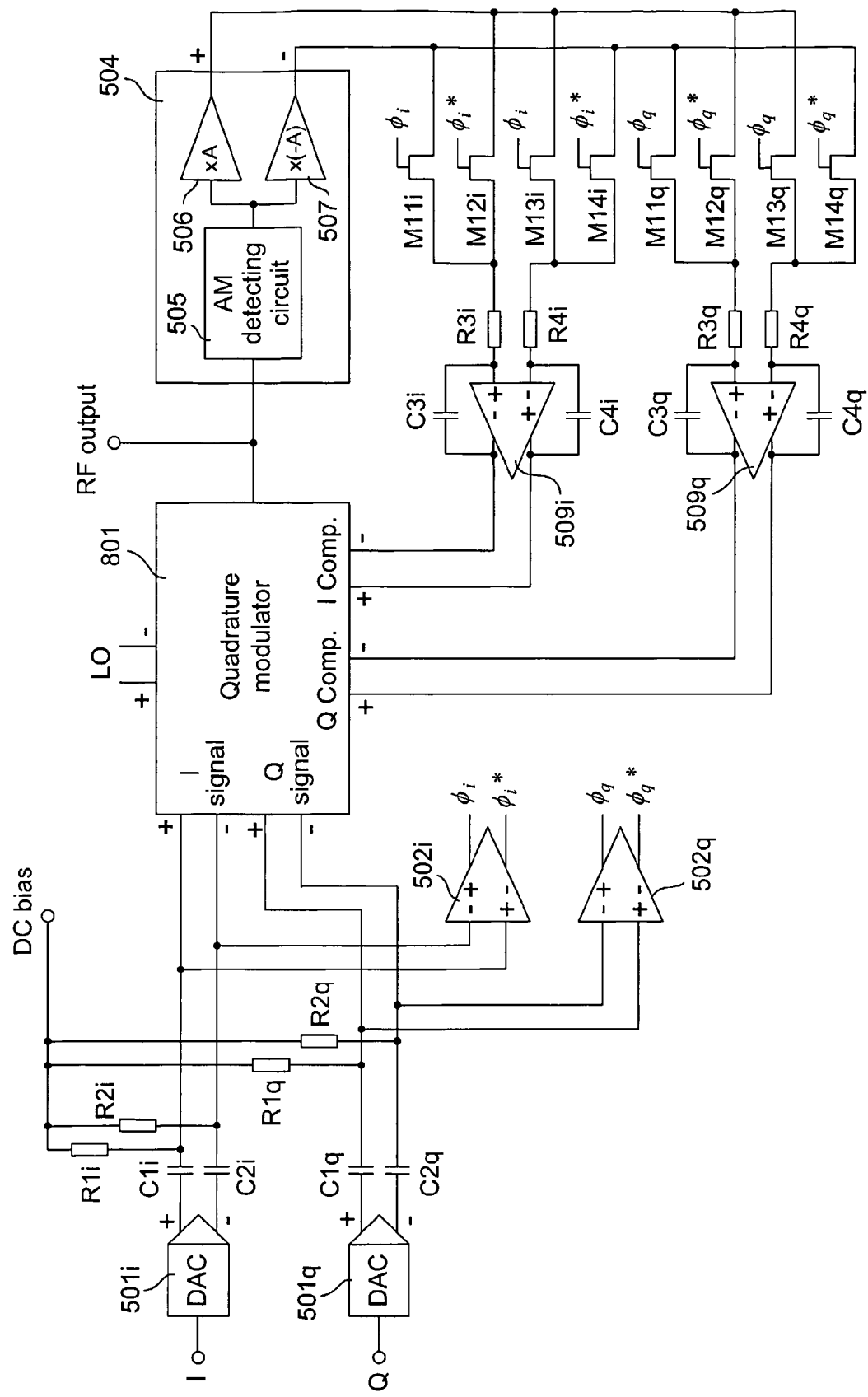
FIG. 8 is a diagram illustrating an analog domain implementation of the arrangement illustrated in FIG. 7.

FIG. 8 illustrates an entirely analog domain implementation of the arrangement illustrated in FIG. 7. Quadrature modulator 801 has balanced baseband signal input terminals for an I component, balanced baseband signal input terminals for a Q component, balanced compensation signal input terminals for the I component, balanced compensation signal input terminals for the Q component, and an RF output terminal. Balanced local oscillation (LO) signal is also supplied to quadrature modulator 801. Since two input circuits for supplying the baseband signals to quadrature modulator 801 and two error calculation circuits are necessary, the circuit shown in FIG. 8 is equivalent to the arrangement in which two sets of the circuit shown in FIG. 6 are provided. In FIG. 8, the constituent elements which are identical to those shown in FIG. 6 are denoted by the same reference numerals with postfixes for indicating the I or Q component. Postfix "i" is added to the reference numerals of circuit components corresponding to the I component, and postfix "q" is added to the reference numerals of circuit components corresponding to the Q component. Envelope detector 504 is shared by the I component circuit and the Q component circuit, and elements related to the envelope detector is indicated without postfixes.

In this example implementation, the modulator module is provided with built-in local oscillator leak compensation. The function and operation of the modulator module shown in FIG. 8 is apparent from the above description.

As shown in FIG. 8, in contrast with the prior art solution, the present embodiment enables a simple completely analog solution to be implemented with useful accuracy, as the critical detection of the I and Q input signals is reduced to a simple sign detection, allowing an accurate and inexpensive comparator to be used. It is an advantage to be able to fully separate the digital and RF chips of a wireless system as these often come from separate part vendors.

It should be noted that even in a fully analog implementation, the comparators monitoring the signs of the input I and Q signals would be expected to have a much lower DC offset than that introduced in the modulator part itself. This can be achieved due to the low frequency of operation of the comparator, allowing the use of larger transistors, and the simplified nature of the comparator block.

Figure 9:
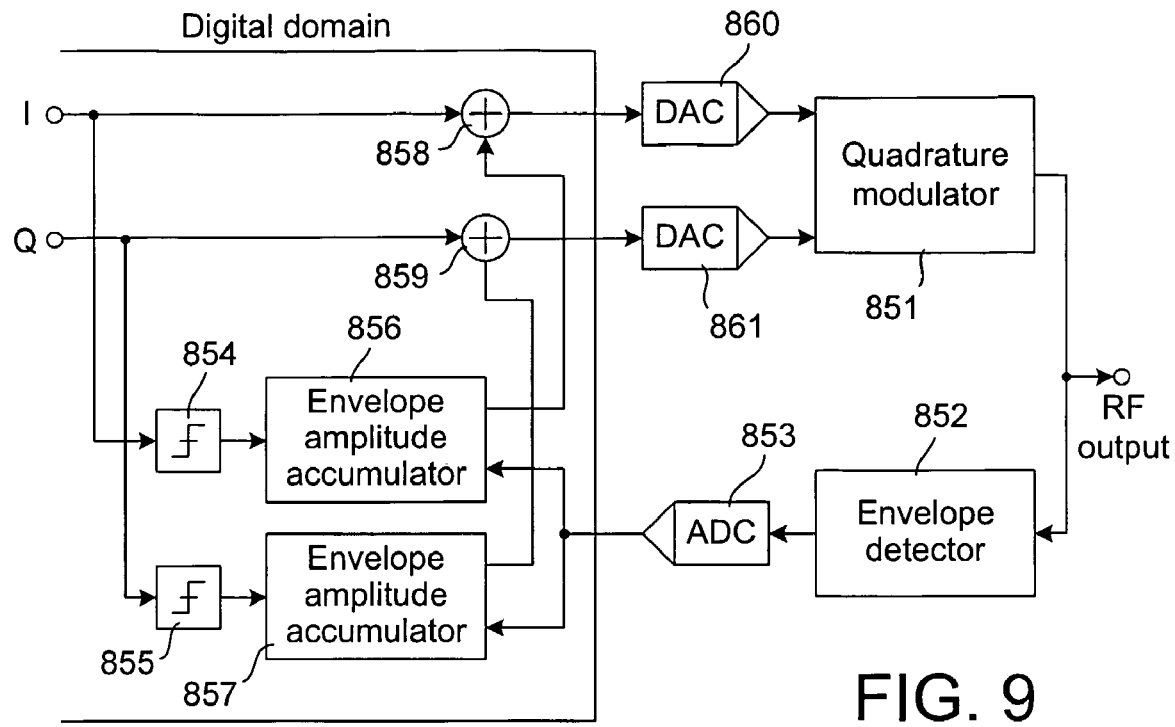
FIG. 9 is a block diagram illustrating an implementation of the invention spanning the analog and digital implementation domains, connected to a quadrature modulator with external DC offset compensation.

FIG. 9 illustrates a semi-digital implementation of a quadrature modulator module according to the present invention. In this arrangement, quadrature modulator 851 has the DSBSC mixers without compensation input terminals, and the error compensation signal is a digital signal and added to the input digital baseband signal.

The output of quadrature modulator 851 is supplied to an RF output terminal and envelope detector 852, and the output of envelope detector 852 is supplied to ADC (analog-to-digital converter) 853 and converted into a digital signal representing the envelope. Envelope detector 852 comprises, for example, an AM detector and performs envelope detection of the RF output signal.

Sign detectors 854, 855 are provided for detecting the sign of I and Q input digital signals, respectively. Sign detectors 854, 855 correspond to the sign extraction units in the analog domain implementation. In general, the sign of a digital value is represented by the MSB (most significant bit) thereof, each of sign detectors 854, 855 can determine the sign of the input signal by detecting the MSB of the input signal. The results of sign detection for I and Q signals are supplied to envelope amplitude accumulators 856, 857, respectively. Accumulator 856 accumulates the output digital signal of ADC 853 so that it adds the digital signal received from ADC 853 to the previously accumulated value when the output of sign detector 854 is "1" and it subtracts the digital signal received from ADC 853 from the previously accumulated value when the output of sign detector 854 is "0". Similarly, accumulator 857 adds or subtracts the digital output of ADC 853 to or from the previously accumulated value based on the output of sign detector 855. Digital Adding circuit 858 adds the digital output from accumulator 856 to the I input digital signal and delivers the sum to DAC 860. Digital Adding circuit 859 adds the digital output from accumulator 857 to the Q input digital signal and delivers the sum to DAC 861. Analog outputs from DACs 860, 861 are supplied to the I and Q input terminals of quadrature modulator 851, respectively.

In the circuit shown in FIG. 9, sign detectors 854, 855, envelope amplitude. accumulators 856, 857 and digital adding circuits 858, 859 constitutes a digital domain block which may be fabricated in a digital IC (integrated circuit) chip. Quadrature modulator 851 and envelope detector 852 still remain in the analog domain block. The function of the envelope amplitude accumulator is equivalent to that of the signal processing unit shown in FIGS. 4 and 5, and the circuit shown in FIG. 9 and the circuit shown in FIGS. 4 and 5 have the same functionality.

In the case of a semi-digital implementation shown in FIG. 9, the sign detectors, accumulators, and digital adding circuits used in the example implementation are less complicated, use less power and silicon area and are more simple to implement than the system of FIG. 2, which requires digital multipliers (i.e., linear correlators).

Figure 10:
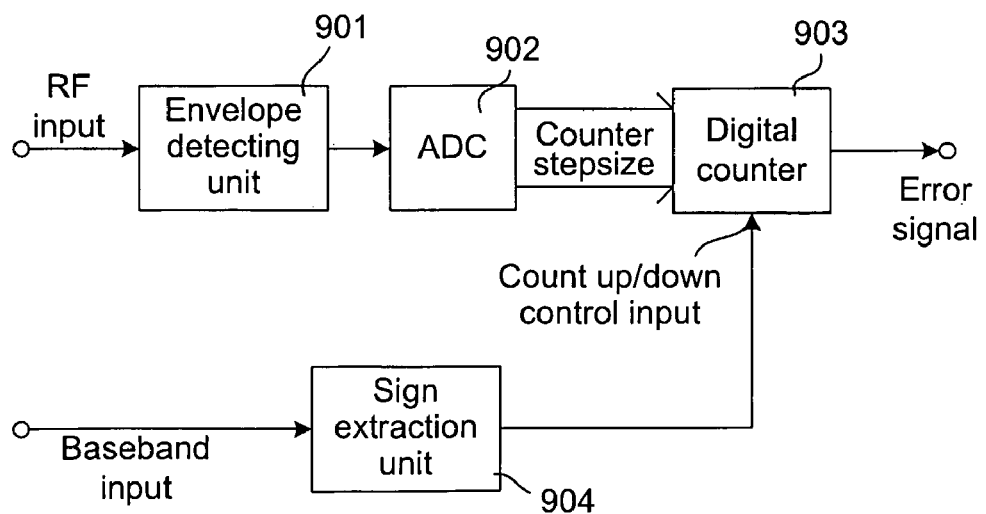
FIG. 10 is a block diagram illustrating an error calculation circuit in digital implementation.

An alternative implementation of the error calculation circuit is shown in FIG. 10. The circuit shown in FIG. 10 is a digital version of the circuit shown in FIG. 4. Here the error compensation signal is obtained by converting, by ADC 902, the output of envelope detector 901 to a digital signal, which is then used to control the step size of up/down digital counter 903. The digital output of ADC 902 represents the amplitude of envelope of the received RF signal and is supplied to digital counter 903 as the step size of the counter. The up or down count direction of the counter is then controlled by the output of sign extraction unit 904 which connected to the baseband signal input.

In this arrangement, the amplitude of the envelope of the RF signal is used to control the step size of digital counter 903, so that the amplitude of successive samples detected by envelope detector 901 are accumulated as the value of the counter. The accumulation is controlled to be positive or negative depending on the sign of the baseband input signal, so that over a period of time the average of the output of counter 903 is zero if no carrier leak exists in the connected modulator. The functionality of the circuit of FIG. 10 is identical to that of FIG. 4.

Figure 11:
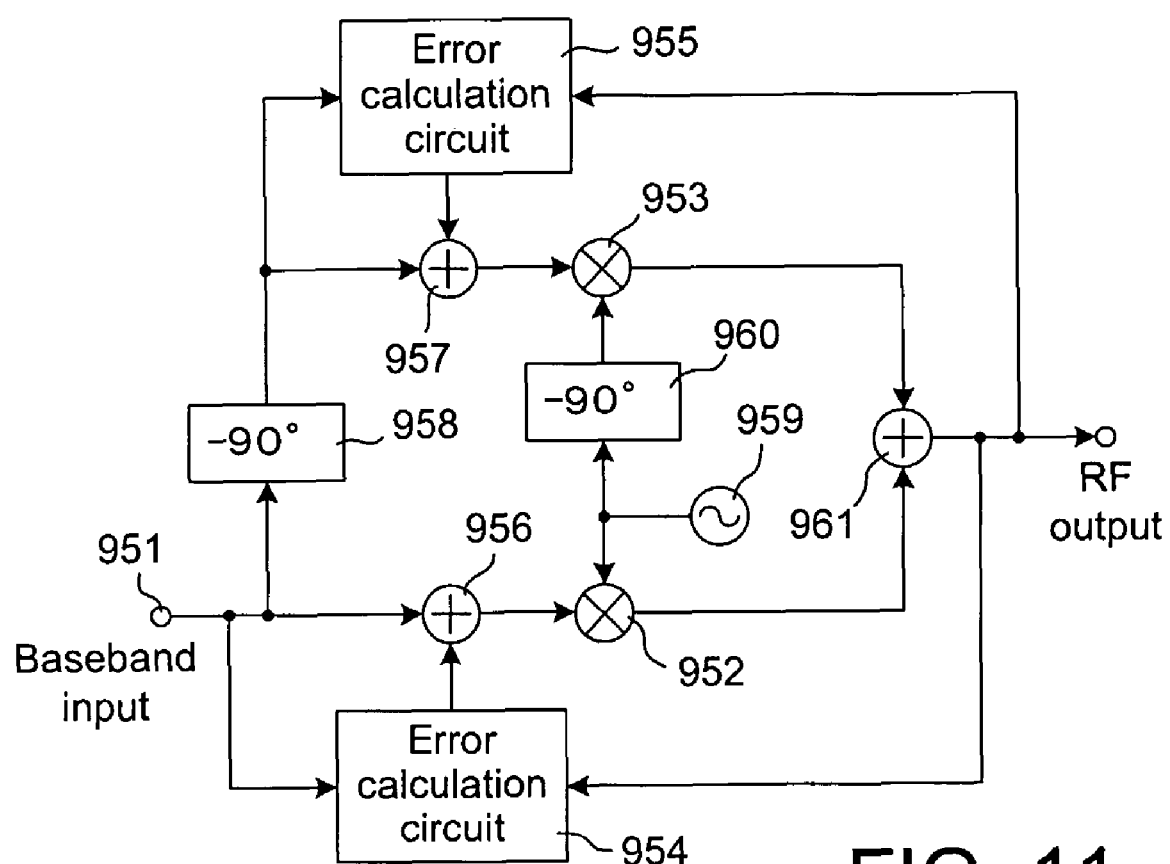
FIG. 11 is a block diagram illustrating a SSB (single sideband) modulator module with a built-in DC offset compensation.

The present invention can be also applied to an SSB (single sideband) modulator. FIG. 11 shows an example implementation of an SSB modulator module according to the present invention. The phase shift method of SSB generation is used in the illustrated implementation.

Although the SSB modulator module has only one baseband input 951, the modulator has two DSBSC mixers 952, 953 and two error calculation circuits 954, 955, so that the error compensation signals may be applied in the same way as for a quadrature modulator module by using internal connection. The baseband signal received at input 951 is directly applied to first error calculation circuit 954 and first adder 956. Second error calculation circuit 955 and second adder 957 receive the baseband signal through phase shifter 958 which shifts the phase of the baseband signal by 90 degrees. The outputs of error calculation circuits 954, 955 are supplied to adders 956, 957, respectively. The outputs of adders 956, 957 are supplied to mixers 952, 953 as baseband signals, respectively. A local oscillation (LO) signal from local oscillator 959 is directly supplied to first mixer 952 and is supplied to second mixer 953 through phase shifter 960 which shifts the phase of the local oscillation signal by 90 degrees. Combiner 961 combines the outputs of mixers 952, 953 and delivers an RF output signal. This RF output signal is supplied to error calculation circuits 954, 955.

The SSB modulator operates to transmit a single sideband signal by feeding the same signal to two separate mixers 952, 953, but with the input to one of mixers 952, 953 the phase of the signal is shifted by 90 degrees. In addition the same local oscillation signal is sent to both mixers 952, 953 but the phase is shifted by 90 degrees at one of the mixers. When the outputs of both mixers 952, 953 are added together at combiner 961, the resulting RF signal has only a single sideband.

Figure 12:
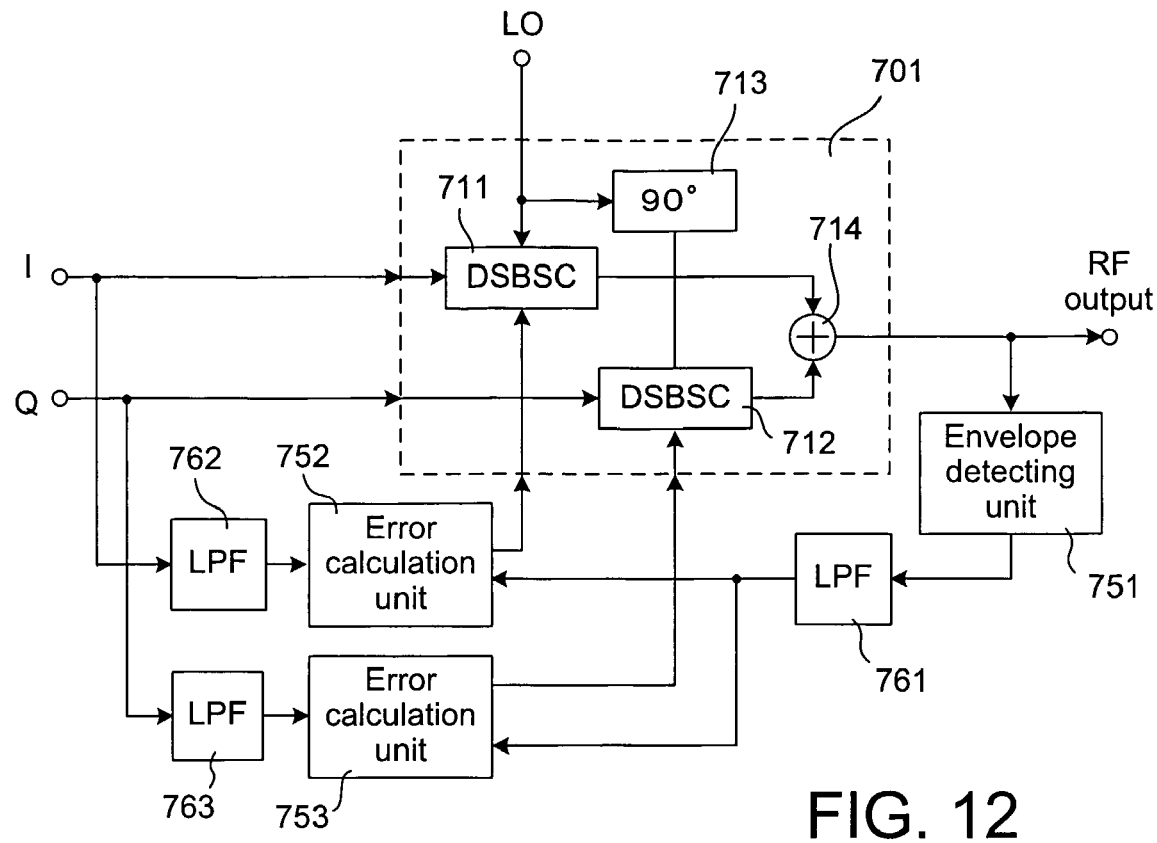
FIG. 12 is a block diagram illustrating another quadrature modulator module in which the envelope and baseband signals are subjected to low-pass filtering.

FIG. 12 shows an alternative implementation of FIG. 7 to allow the cancellation of DC errors where the signal bandwidth can be made much higher than the bandwidth of the error cancellation hardware. In order to achieve this, low-pass filters (LPFs) can be inserted at the output of the envelope detecting unit and at the connections from input terminals of the baseband I and Q signals.

Figure 13:
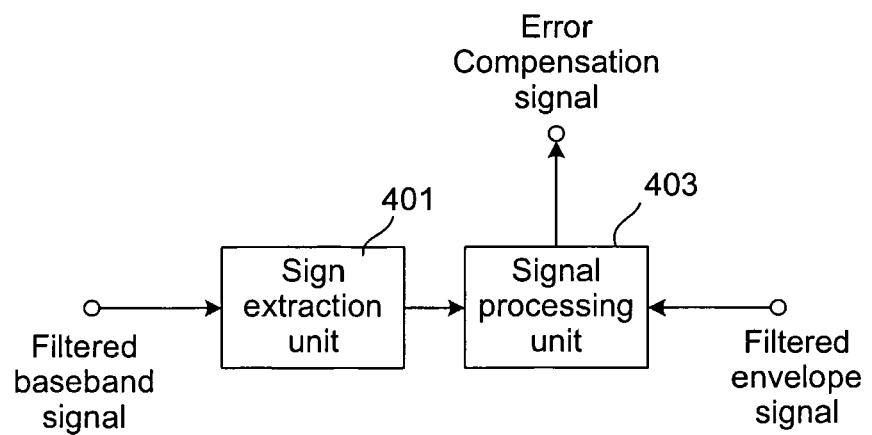
FIG. 13 is a block diagram illustrating error calculation unit used within the quadrature modulator module illustrated in FIG. 12.

Separate envelope detecting unit 751 receives the RF output signal of quadrature module 701, and the output of envelope detecting unit 751 is supplied to low-pass filter 761. The output of low-pass filter 751 is supplied to error calculation units 752, 753 in parallel. FIG. 13 illustrates the configuration of each of error calculation circuits 752, 753. The error calculation unit is constructed by removing the internal envelope detecting unit from the error calculation circuit shown in FIG. 4. Signal processing unit 403 of each error calculation unit receives the output of external envelope detecting unit 751 through low-pass filter 761. Sign extraction unit 401 of error calculation unit 752 for the I component receives the I baseband signal through low-pass filter 762. Similarly, sign extraction unit 401 of error calculation unit 753 for the Q component receives the Q baseband signal through low-pass filter 763. The error calculation unit can be implemented in either a fully analog or fully digital way using ADCs. The overall operations and functionalities of the quadrature modulator module illustrated in FIG. 12 are similar to those of the quadrature modulator modules described above.

While a preferred embodiment of the present invention has been described using specific terms, such description is for illustrative purposes only, and it is to be understood that changes and variations may be made without departing from the spirit or scope of the following claims.

The invention claimed is:

1. An error calculation circuit for a mixer, comprising:
a sign extraction unit for extracting sign of an information signal which is applied to the mixer;
an envelope detecting unit for performing envelope detection on an output signal of the mixer; and
a signal processing unit for generating a compensation signal based on result of the sign extraction and envelope detection,
wherein said sign extraction unit comprises a comparator which obtains the sign of the information signal.

2. The circuit according to claim 1, wherein the information signal is a baseband signal.

3. The circuit according to claim 2, further comprising a first low-pass filter and a second low-pass filter, wherein an output of the envelope detection unit is supplied to the signal processing unit through the first low-pass filter, and the baseband signal is supplied to the sign extraction unit through the second low-pass filter.

4. An error calculation circuit for a mixer, comprising:
a sign extraction unit for extracting sign of an information signal which is applied to the mixer;
an envelope detecting unit for performing envelope detection on an output signal of the mixer; and
a signal processing unit for generating a compensation signal based on result of the sign extraction and envelope detection,
wherein said signal processing unit comprises means for multiplying the sign of the information signal by an amplitude of an envelope obtained by the envelope detection, and means for extracting the compensating signal from result of the multiplying.

5. The circuit according to claim 4, wherein the extracting means comprises an integrator to which the result of multiplying is fed.

6. The circuit according to claim 4, wherein the extracting means comprises means for averaging the result of the multiplying.

7. An error calculation circuit for a mixer, comprising:
a sign extraction unit for extracting sign of an information signal which is applied to the mixer;
an envelope detecting unit for performing envelope detection on an output signal of the mixer; and
a signal processing unit for generating a compensation signal based on result of the sign extraction and envelope detection, wherein said signal processing unit comprises an accumulator for accumulating an amplitude value of an envelope obtained by the envelope detection so that the amplitude value is added to or subtracted from a previously accumulated value in accordance with the sign of the information signal, a current value accumulated in the accumulator being delivered as the compensation signal.

8. An error calculation circuit for a mixer, comprising:
a sign extraction unit for extracting sign of an information signal which is applied to the mixer;
an envelope detecting unit for performing envelope detection on an output signal of the mixer; and
a signal processing unit for generating a compensation signal based on result of the sign extraction and envelope detection,
wherein said signal processing unit comprises a digital counter with a counter step size controlled by an amplitude of an envelope obtained by the envelope detection and a counter direction controlled by the sign of the information signal.

9. An error calculation circuit for a mixer, comprising:
a sign extraction unit for extracting sign of an information signal which is applied to the mixer;
an envelope detecting unit for performing envelope detection on an output signal of the mixer; and
a signal processing unit for generating a compensation signal based on result of the sign extraction and envelope detection,
wherein said signal processing unit comprises:
a non-inverting amplifier for amplifying an amplitude of an envelope obtained by the envelope detection;
an inverting amplifier for amplifying the amplitude of the envelope, said inverting amplifier having the same absolute amplifying factor as that of the non-inverting amplifier;
a switch selecting one of outputs of the non-inverting amplifier and inverting amplifier in accordance with the sign of the information signal; and
an integrator for integrating output of the switch to generate the compensation signal.

10. An error calculation circuit for a mixer, comprising:
a sign extraction unit for extracting sign of an information signal which is applied to the mixer;
an envelope detecting unit for performing envelope detection on an output signal of the mixer;
a signal processing unit for generating a compensation signal based on result of the sign extraction and envelope detection; and
a first low-pass filter and a second low-pass filter,
wherein an output of the envelope detection unit is supplied to the signal processing unit through the first low-pass filter, and the information signal is supplied to the sign extraction unit through the second low-pass filter.

11. A mixer module comprising a mixer and an error calculation circuit, wherein said error calculation circuit comprises:
a sign extraction unit for extracting sign of an information signal which is applied to the mixer;
an envelope detecting unit for performing envelope detection on a signal supplied from an output of the mixer; and
a signal processing unit for generating a compensation signal based on the result of the sign extraction and envelope detection, said compensation signal being fed to the mixer,
wherein the error calculation circuit further comprises a first low-pass filter and a second low-pass filter, an output of the envelope detection unit is supplied to the signal processing unit through the first low-pass filter, and the information signal is supplied to the sign extraction unit through the second low-pass filter.

12. A quadrature modulator module comprising:
a quadrature modulator comprising a first mixer receiving a first information signal, a second mixer receiving a second information signal, and an adder adding outputs of the first mixer and the second mixer to output an RF signal;
an envelope detecting unit for performing envelope detection on the RF signal;
a first sign extraction unit for extracting sign of the first information signal;
a second sign extraction unit for extracting sign of the second information signal;
a first signal processing unit for generating a first compensation signal based on the result of the sign extraction at said first sign extraction unit and envelope detection, said first compensation signal being fed to the first mixer;
a second signal processing unit for generating a second compensation signal based on the result of the sign extraction at said second sign extraction unit and the envelope detection, said second compensation signal being fed to the second mixer;
a first low-pass filter for performing low-pass filtering on an output of the envelope detection unit, the filtered output of the envelope detecting unit being fed to the first and second signal processing units;
a second low-pass filter for performing low-pass filtering on the first information signal, the filtered first information signal being fed to the first sign extraction unit; and
a third low-pass filter for performing low-pass filtering on the second information signal, the filtered second information signal being fed to the second sign extraction unit.

13. A method for suppressing a carrier leak at an output signal of a mixer, comprising the steps of:
   extracting sign of an information signal which is applied to the mixer;
   detecting an envelope of an output signal of the mixer;
   calculating a compensation signal to compensate the carrier leak at the output signal of the mixer by using multiplication of the sign of the information signal by an amplitude of the envelope; and
   applying the compensation signal to the mixer to suppress the carrier leak.

* * * * *